(12) United States Patent
Conboy et al.

(10) Patent No.: US 6,457,587 B1
(45) Date of Patent: Oct. 1, 2002

(54) INTEGRATED RETICLE SORTER AND STOCKER

(75) Inventors: Michael R. Conboy; Elfido Coss, Jr., both of Austin; Russel Shirley, Pflugerville, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/545,768

(22) Filed: Apr. 10, 2000

Related U.S. Application Data

(63) Continuation-in-part of application No. 09/496,874, filed on Feb. 2, 2000, now Pat. No. 6,403,905.

(51) Int. Cl.[7] .................................................. B07C 5/00
(52) U.S. Cl. ....................... 209/630; 209/583; 209/586; 438/308
(58) Field of Search ................................ 209/577, 583, 209/630, 586; 438/308, 487

(56) References Cited

U.S. PATENT DOCUMENTS

| | | | |
|---|---|---|---|
| 4,569,123 A | * 2/1986 | Ishii et al. .............. | 438/368 X |
| 5,751,581 A | 5/1998 | Tau et al. | |
| 5,838,566 A | 11/1998 | Conboy et al. | |
| 5,859,964 A | 1/1999 | Wang et al. ........... | 395/185.01 |
| 5,937,304 A | * 8/1999 | Yoshinouchi et al. ... | 438/308 X |
| 5,972,727 A | 10/1999 | Ryan et al. ............. | 250/548 X |
| 5,996,595 A | * 12/1999 | Olesen et al. .......... | 438/906 X |
| 6,000,947 A | * 12/1999 | Minne et al. ............... | 437/228 |

* cited by examiner

*Primary Examiner*—Tuan N. Nguyen

(57) ABSTRACT

Reticles are selected for use in a wafer processing system based on the wafer-processing recipe and on the level of degradation exhibited by the reticle after multiple exposures to light and constant physical handling. In an example embodiment of an integrated reticle sorter and stocker, a scanner identifies the reticle and gathers dimensional data on each reticle. A sorter sorts reticles within reticle pods according to the processing recipe and stores the pods within a storage location in the stocker. A computer arrangement then records information from the scanner and the sorter and assesses whether any of the reticles has degraded beyond an acceptable level of usage.

20 Claims, 4 Drawing Sheets

INTEGRATED RETICLE SORTER AND STOCKER

RELATED APPLICATION

This application is a continuation-in-part of the application entitled "Reticle Stocking and Sorting Management System," having Ser. No. 09/496,874 filed on Feb. 2, 2000, now U.S. Pat. No. 6,403,905 issued Jun. 11, 2002, which is hereby incorporated by reference.

FIELD OF THE INVENTION

The present invention generally relates to manufacturing processes and equipment using masks and masking structures and, more particularly, to the selection and storage of masks and mask structures in an entire semiconductor processing system.

BACKGROUND OF THE INVENTION

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition. Material stockers or stocking tools generally are located about the plant and store semiconductor wafers waiting to be processed. The wafers are typically stored in containers, such as cassettes, each of which can hold up to 25 wafers. The cassettes are then stored in carriers that facilitate movement throughout the plant.

The semiconductor fabrication plant, including the bays, material stockers and the interconnecting path, typically operates under control of a distributed computer system running a factory management program. In this environment, the automated material handling system (AMHS) conceptually includes the cassettes, the transportation system (e.g., paths) and control system (e.g., the distributed computer system). The AMHS also typically include empty carriers management system as well as a separate test wafer management system.

A wafer is subjected to a photolithography process of some type and usually involves applying a layer of photoresist material, such as silicon dioxide, over the surface of a wafer using a coating machine. The wafer is then moved to an exposure tool, such as a photolithography stepper, that exposes the photoresist layer to a patterned light source. The light source is patterned using a mask structure or a reticle. The reticle contains clear and opaque features that generally define the pattern to be created in the photoresist layer. The exposed photoresist is then developed and regions of the photoresist are dissolved leaving a pattern on the photoresist layer. The exposed portions of the underlying wafer are then subjected to further processing.

Depending on the type of IC device being manufactured, the wafer may be subjected to the photolithography process several times as layers are formed successively over prior layers to ultimately form the semiconductor device. To perform the various photolithography processes, a semiconductor plant has a photolithography processing area that occupies a substantial amount of floor space and involves a high level of capital investment to maintain. The photolithography area usually includes a number of steppers that utilize an entire cataloged library of reticles. The number of reticles that need to be readily available can easily exceed one thousand, due to the number of different products that can be manufactured in one facility, with each reticle having a replacement cost of about $15 K. The reticles are usually stored in a reticle storage system, centrally located within the photolithography area, and are cataloged by reticle identification number. The reticle is then transported via a conveyor system to the particular stepper in need of a certain reticle. One of the problems with managing reticles is that they are very delicate structures and can be damaged easily by excessive handling. They also need to be routinely inspected to ensure that they are still viable for use in making the intended product.

Cycle times for the photolithography processing areas have increased due to the wafer processing system's limited resources that are available to manage all of the options available on the processing line. One of the problems with the current reticle management systems is the substantial manual intervention required in managing the finite number of reticles in inventory, the limited number of the duplicate reticles available and the finite number of pods that move the reticles around the photolithography area. In addition, operators on the line must manually coordinate any changes to the reticle flow or storage plan. This approach has led to delays in the wafer processing system and has caused inefficiencies in manufacturing. Further, midstream changes in production are relatively difficult and slow to respond to due to the decentralized management of reticles and reticle storage locations.

SUMMARY OF THE INVENTION

The present invention is directed to addressing the above and other needs in connection with improving efficiencies of reticle stocking and sorting processes.

According to one aspect of the invention, it has been discovered that allowing on-demand reticle selection reduces cycle time and increases flexibility on the manufacturing line. It has also been discovered that reducing the amount of handling of reticles and determining early the level of degradation that a reticle is exhibiting reduces the overall capital investment in this area. An integrated reticle sorter/stocker device, according to the present invention, reduces the handling of reticles and aids in the real time evaluation of the viability of reticles for wafer processing.

According to another aspect of the invention, a mask stocking and sorting management system is used in a manufacturing facility having a material handling system that presents a mask to a photolithography process area. The system includes an arrangement of pods, each of the pods including at least one mask, and a host system adapted to rearrange the pods at a mask storage location as a function of a mask identification code and an externally provided directive indicating a masking sequence change. In another related embodiment at least one mask sorting apparatus can be coupled to the mask storage system and to the host system to provide more flexibility in the overall mask management system. An important advantage is that the host system reduces the delivery time of a mask to the photolithography area and reduces the number of buffer pods used in the material handling.

According to another aspect of the present invention, a method of stocking and sorting masks is used in a manufacturing facility having a material handling system for presenting a mask to a photolithography process area. An arrangement of pods is provided with each of the pods including at least one mask. The pods are then rearranged at a mask storage location as a function of a mask identification code and an externally provided directive indicating a masking sequence change. An important advantage is that the method reduces the delivery time of a mask to the photolithography area and reduces the number of buffer pods used in the material handling.

In yet another aspect of the present invention, a method of stocking and sorting masks in a manufacturing process involves a photolithography process area and a material handling system. The method includes conducting a status check of all of the masks in the manufacturing process and then preparing a mix of masks within a mask storage system to be transported to the photolithography area via the material handling system. A host system is polled to determine the existence of an instruction change that can change the flow of masks in the manufacturing process. The masks are then used in the photolithography process, are returned to the storage location and the status of the masks are communicated to the host system.

In yet another aspect of the invention, an apparatus for sorting and stocking a plurality of masks for use in a wafer processing system includes a scanning device that identifies a mask identification code located on each mask and scans the dimensions of each mask. A sorting device sorts the masks within a stored location. A computer arrangement is adapted to control the scanning device and the sorting device and to record data retrieved therefrom, the computer arrangement is adapted to analyze the mask data in determining a level of mask degradation for each mask before a mask selection is made.

In yet another aspect of the invention, a system for sorting and stocking masks for use in a wafer processing facility includes a mask data set generator that includes information on a mask identification code for each mask and includes a dimension data for each mask. A mask degradation analyzer adapted to conduct degradation analysis on each mask that includes a comparison of the mask data set to a mask baseline dimension so as to generate degradation data for each mask. A computer arrangement is used to record and analyze the degradation data and the mask data set before making a mask selection. A mask-sorting device is adapted to rearranging the masks at a mask storage location in response a mask selection command from the computer arrangement based on the data analysis.

In yet another aspect of the invention, a method of sorting and stocking masks used in a wafer processing facility includes providing a mask data set that includes information on a mask identification code for each mask and a dimension data for each mask. A computer arrangement is used to conduct a degradation analysis on each mask that includes comparing the mask data with a baseline dimension of each mask so as to generate degradation data for each mask. The computer arrangement records and analyzes the degradation data and the mask data set before a mask selection is made. The masks are then rearranged at a mask storage location in response to a command from the computer arrangement based on the data analysis.

In yet another aspect of the present invention, a method of sorting and stocking masks in a wafer processing facility, having a photolithography processing area, includes conducting a status check of masks in the facility and generating a mask data set. A mix of masks is prepared within a mask storage system and the mix is then presented to the photolithography area. A host system is polled to determine existence of an instruction that changes the flow of masks in the photolithography processing area. A degradation analysis is conducted on the masks so as to generate degradation data for each mask and then a computer arrangement is used to record and analyze the degradation data and the mask data set. The masks are rearranged at a mask storage location in response to a command from the computer arrangement based on analysis. The mask status is then communicated to the host system.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
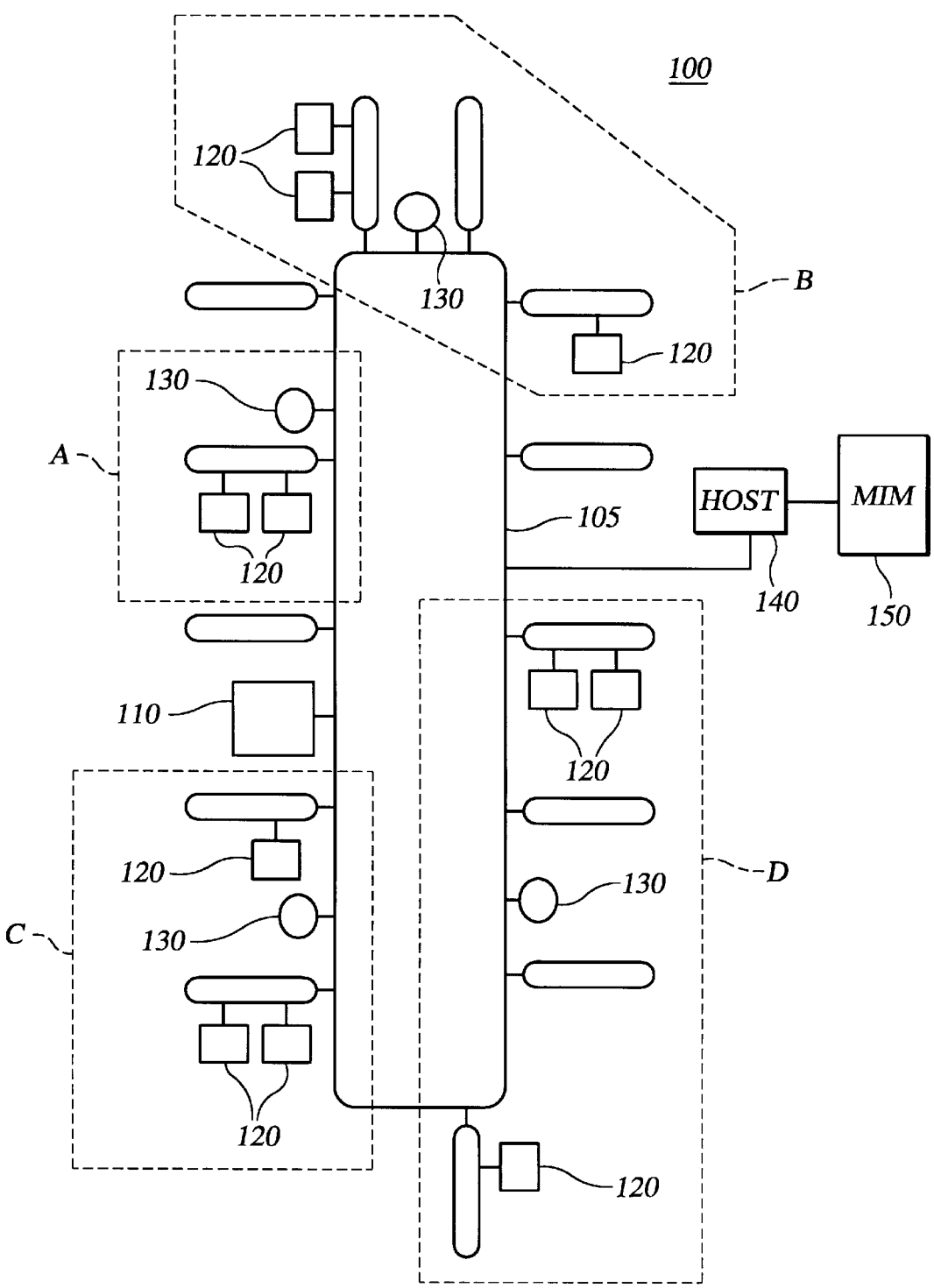
FIG. 1 illustrates an exemplary semiconductor fabrication facility in accordance with an example embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a system and method for managing and handling masks in an IC manufacturing environment, for example, where an automated material handling system is used. It has been discovered that the present invention is particularly suited for sorting and stocking reticles in a semiconductor fabrication facility such that delivery time of the reticle is minimized while the system is responsive to changing conditions external to the manufacturing process. While the present invention is not necessarily limited to such a wafer processing application, the invention will be better appreciated using a discussion of exemplary embodiments in such a specific context.

In an example embodiment, a mask stocking and sorting management system is used in a manufacturing facility having a material handling system that presents a mask to a photolithography process area. The system includes an arrangement of pods, each of the pods including at least one mask, and a host system adapted to rearrange the pods at a mask storage location as a function of a mask identification code and an externally provided directive indicating a masking sequence change. In a related embodiment at least one mask sorting apparatus is coupled to the mask storage system and to the host system to provide more flexibility in the overall mask management system. An important advantage is that the method reduces the delivery time of a mask to the photolithography area and reduces the number of buffer pods used in the material handling.

In one application of the present invention, reticles are substituted for the masks. The reticle management system includes a management-input module that is coupled to the host system to integrate high-level management directives into the selection and usage of reticles. Reticles and reticle storage locations are managed as a system, however reticle sorters are optionally integrated to provide more flexibility in the reticle management system closer to the steppers. In a related application of the present invention, reticles are sorted and stocked using a single apparatus that is capable of selecting a mask as a function of a processing recipe and as a function of a level of degradation of each mask.

Referring now to the figures, FIG. 1 illustrates an exemplary fabrication facility having a reticle stocking and sorting management system that is integrated into a wafer processing system. The exemplary fabrication facility 100 includes a transportation path 105, such as a conveyor belt, for moving reticles around the facility, but primarily within the photolithography area, a reticle storage system 110 (storage of reticles within cassettes) and a number of photolithography exposure tools such as steppers 120. The steppers use a number of different reticles for fabricating layers of semiconductor wafers. This approach is not necessarily limited to the use of photolithography steppers, and can be applied to other types of exposure tools that use a reticle or a mask to transfer a pattern onto a wafer. While not shown, it should be appreciated that each of the reticle storage system 110, reticle sorters 130 and photolithography steppers 120 are communicatively coupled to a host system 140 and operate under instructions from the host system. The reticle storage system 110 also includes a buffer for storing reticles and cassettes and an inspection system for inspecting various characteristics of the reticles that are transmitted to the host system for database storage. A sorting system capable of rearranging the reticles within the cassettes as dictated by the host system is also included in reticle storage system In another embodiment, one or more reticle sorters 130, each associated with a group of one or more of the photolithography steppers 120, is incorporated into the reticle management system that interfaces with steppers 120. The reticle sorters interface with multiple storage systems that are incorporated into the current wafer processing system. The illustrated embodiment includes four reticle sorters 130 each of which handle the reticle sorting for an associated cell of photolithography steppers 120. Exemplary cell groupings A, B, C, and D are shown in FIG. 1. For many applications, one reticle sorter for every 2 to 8 photolithography steppers would be suitable. A number of pods with reticles stored therein are stored within the reticle sorters and within the reticle storage system. Path 105 includes a mechanism, such as a conveyor system, for coupling the reticle storage system and the reticle sorter to the material handling system. A host system 140 is coupled to the reticle sorter, the reticle storage system and the material handling system. The host system is programmed to track and control the movement of reticles and the pods in the material handling system such that the delivery time of a reticle to the photolithography process area is minimized. In one specific implementation, the reticle sorter 130 is implemented as described in U.S. Pat. No. 5,972,727 issued Oct. 26, 1999 to Ryan et al., entitled "Reticle Sorter," which is herein incorporated by reference.

The reticle management system further includes a management-input module 150 that is coupled to host system 140 and the material handling system for integrating management directives into the reticle management system. In one example, the management input module 150 is implemented via a computer that is programmed to change the selection of masks to be used in the manufacturing process in response to high level directives that override the current manufacturing program. In another embodiment, module 150 incorporates a business rule module, in the form of a computer having a software program that interfaces with the host system and material handling system, that directs other portions of the manufacturing line to work with the reticle management system to comply with the instructions coming from management module 150.

The management input module is also coupled to subsystems that include empty cassette management, test wafer management, carrier management and a business rules module. This ensures that the reticles are managed integrally with these other materials that are important in the wafer manufacturing system. The management-input module also assists in out of order processing management of masks and wafers that occurs due to the integration of new instructions into the wafer manufacturing system. For further details on the management input module and its mode of operation, reference is made to the concurrently filed patent application entitled "Integration of Business Rule Parameters in Priority Setting of Wafer Processing," having Ser. No. 09/496,205 and filed on Feb. 2, 2000, which is herein incorporated by reference.

Host system 140 is programmed to create a pod sequence at the reticle storage system location in order to generate the desired mix of reticles as they are being released to the photolithography area. The host system is also programmed to diminish conflict problems when more than one location in the photolithography area requires use of the same reticle at about the same time. In an alternative embodiment, the host system manages the reticle stocking and sorting operations with only reticle stocking locations that are coupled to the material handling system via a transport path. However, adding reticle sorters to the system adds to the flexibility of the management system. The host system is programmed to work with a finite number of pods and reticles since these resources are expensive and supply is limited.

Figure 2:
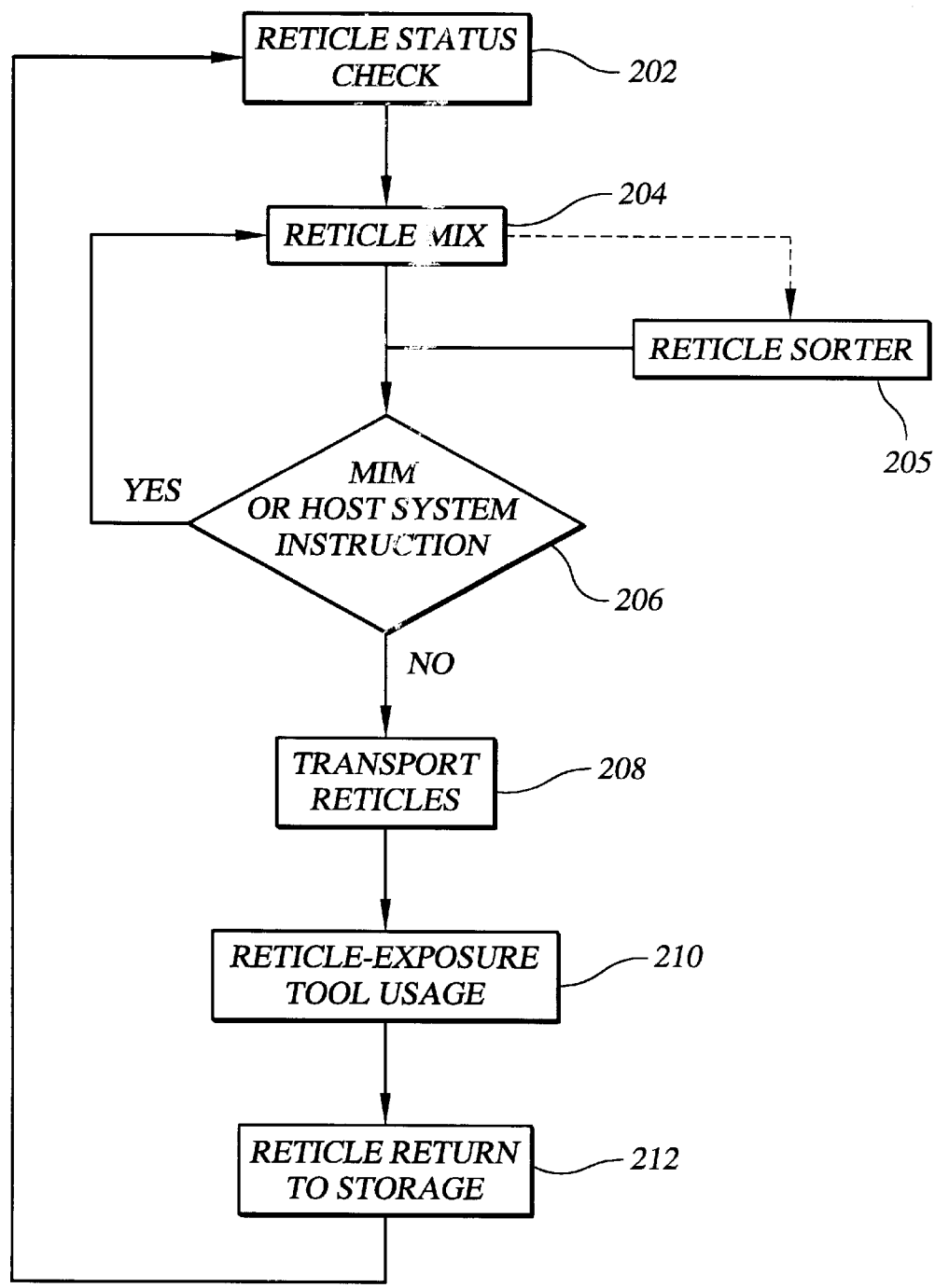
FIG. 2 illustrates a process flow for a reticle management system in accordance with an example embodiment of the invention.

Referring to FIG. 2, a flowchart 200 illustrates the steps that the reticle management system follows to manage the reticles, the reticle sorters and the reticle storage locations as a subsystem of the wafer manufacturing system. The host system conducts a reticle status check at 202 by reticle identification number to determine location and condition of the entire reticle inventory. The reticle mix at 204 is prepared for release into the material handling system. Reticles are selected by the hosts system based on product types and are associated with a particular wafer lot. In an alternative system, the reticle mix proceeds to a reticle sorter at 205, if the system has reticle sorters, before polling at 206 the management input module or host system to determine if additional instructions have been issued that might change the mix or flow of reticles. Once the reticles arrive at 205, the reticle sorters also poll at 206 the system for new instructions. Any instruction change from the host system or the management input module initiates a new reticle mix at either the reticle storage location or the reticle sorter. If an instruction change is not provided, the reticles are transported at 208 to the photolithography tools at 210. The reticles are then returned at 212 to the either the sorter or the storage location and optionally are inspected before being stored to ensure that the reticles are still viable for manufacturing use. The status of the reticle is then registered in the host system database at 202.

Figure 3:
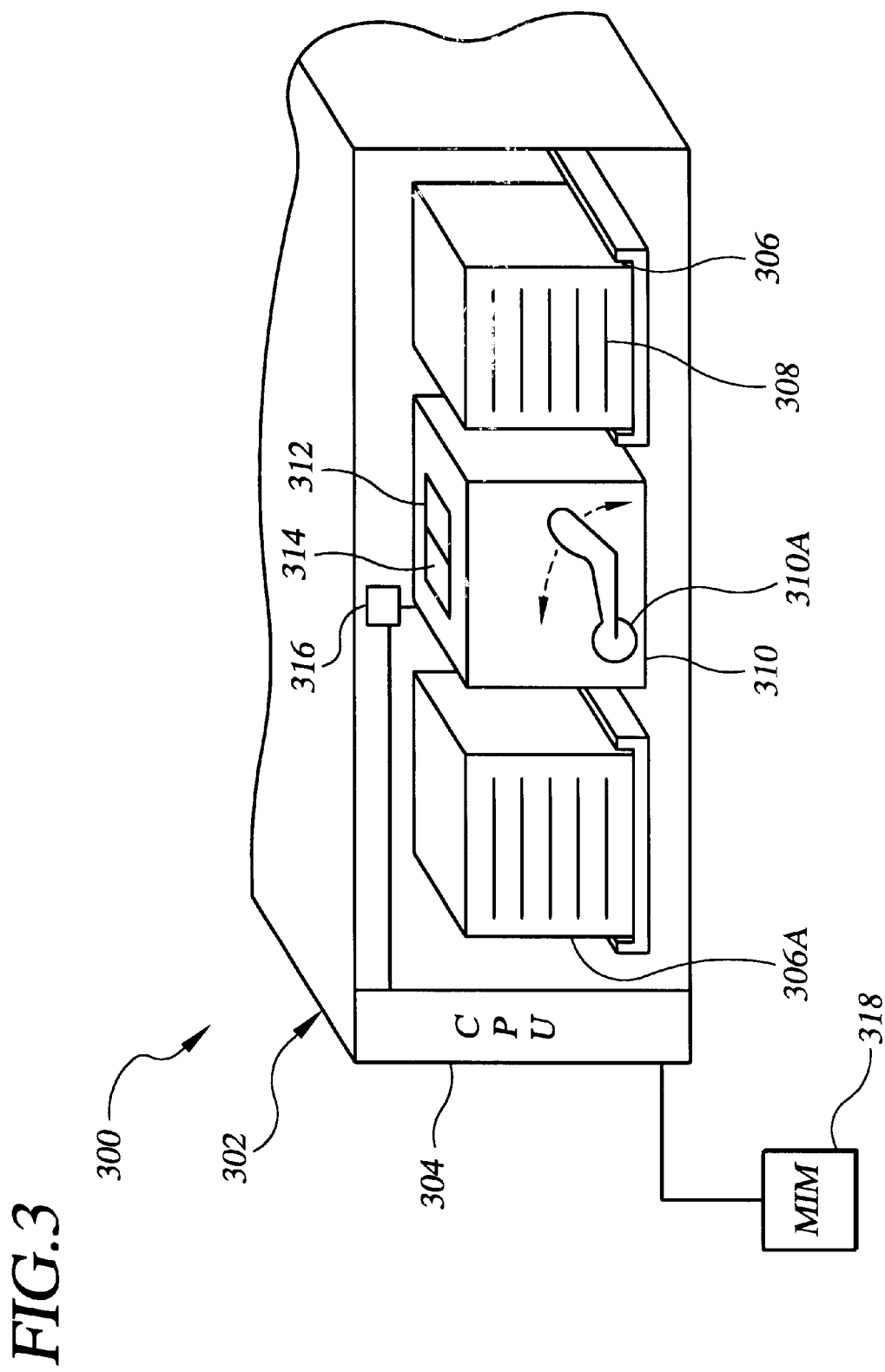
FIG. 3 illustrates an integrated reticle sorter and stocker in accordance with an example embodiment of the invention.

Referring briefly to FIG. 1, in a related embodiment reticle sorters 130 are substituted with integrated reticle sorter and stocking devices 300, an example of which is shown in FIG. 3. Reticle sorter/stocker device 300 includes an enclosure 302 that is coupled to a computer arrangement 304, a rack of reticle or mask pods 306 and a set of reticles 308 that are located within the pods. Adjacent to rack 306 is located a sorting device 310 having therein a robotic arm 310A that removes the pods from the rack and rearranges the reticles located within the pods. In one example, the sorter device is a robotic arm that has pick and place capabilities. The reticles are rearranged in the pods by the robotic arm in response to a processing recipe that is to be applied to a lot of wafers. Depending on the condition of some of the reticles, some of the reticles are removed from the processing system due to their degraded condition resulting from multiple light exposures and constant physical handling. Reticles that are exposed too many times and that are handled too often become worn or damaged and are no longer acceptable for use on the wafer processing line. The reticle condition information is then communicated to computer 304.

On the other side of sorting device 310 is located a storage area 306A of pods with masks that are available for immediate use or are available for prepositioning at the photolithography processing area to reduce processing cycle time. A scanning device 312 is coupled to sorting device 310 and scans the reticles within sorting device 310 to identify each reticle by their identification codes. In one example, the scanning device is an optical reader reads the code on the reticle. In another example, the scanning device is a laser that scans the surface of the reticle to gather dimensional data that is recorded in a computer for use later in data analysis. The computer arrangement is adapted to periodically verify that the masks are sorted by having the optical reader scan the reticles codes of the masks that are in their pods. The computer arrangement initiates a sorting function, with the help of the robotic arm, when the masks are not properly sorted. The computer is also adapted to conduct content verification of the mask pods as well as a mask de-assemble operation where a sorting error has occurred. The computer arrangement enables the robotic arm to preposition masks in the photolithography process in response to a processing recipe that is communicated to the computer from the host system. The processing recipes determine the type of reticles to be used in the photolithography processing area.

In a related embodiment, the capabilities of scanning device 312 are enhanced by adding optical module 314 that aids scanning device 312 in gathering dimensional data on the reticles that are being sorted. The dimensional data as well as the reticle identification data is transmitted via a communications interface 316 to computer arrangement 304 for recording purposes. Computer arrangement 304 includes a reticle degradation modeling module, in the form of a software program, that utilizes the reticle dimensional data to determine how much a particular reticle has been degraded due to the multiple exposures and the constant handling. The degradation modeling module couples the mask degradation information to the reticle identification code and tracks the data to ensure that a particular reticle is still within a predefined, acceptable level for making images. In one embodiment, the computer arrangement is adapted to track the number of exposures and the number of times each mask is handled for use as data in the mask degradation module.

In a related embodiment, a management-input module 318 is coupled to computer 304 to integrate external directives with reticle sorter/stocker 300. In one embodiment, the input module 318 is a software program that operates within computer 304; in another embodiment the input module is a standalone computer with software that interfaces with computer 304. Changes in processing recipes that lead to changes in reticle mixes are integrated into the operation of reticle sorter/stocker 300. In another embodiment, enclosure 302 includes a barrier that is disposed between sorting device 310 and reticle storage 306A to reduce the amount of dust and contaminants that reach the stored reticles. To improve on the clean environment, a filtering and airflow system is added to enclosure 302. To reduce vibrations within enclosure 302, a vibration control system is coupled to the enclosure. In a related embodiment, enclosure 302 is compartmentalized to provide a stocking portion and a sorting portion that can be decoupled to operate independently of each other.

Figure 4:
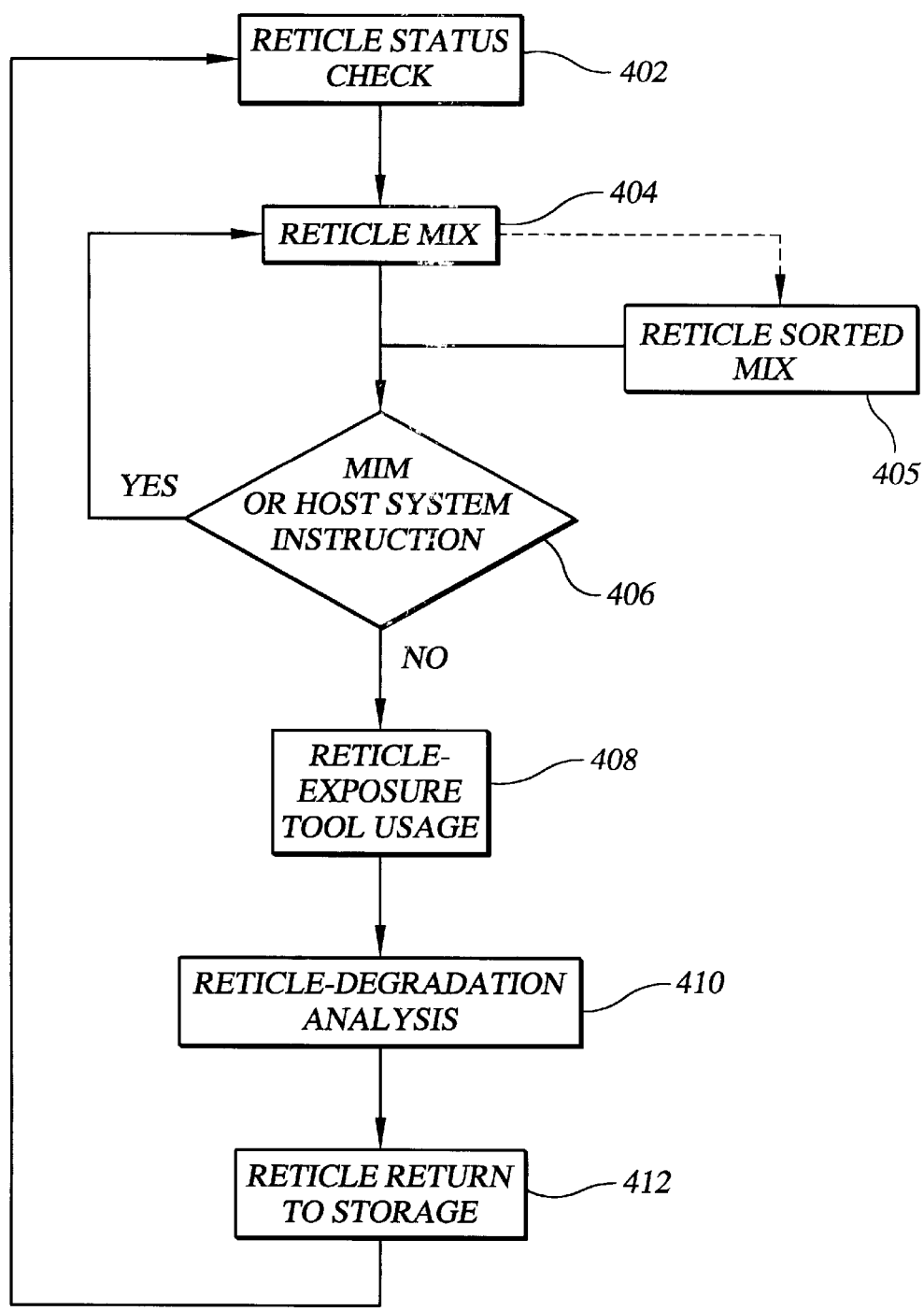
FIG. 4 illustrates a process flow diagram of the example integrated reticle sorter/stocker handling and storing reticles in accordance with an example embodiment of the invention.

Referring to FIG. 4, a flowchart 400 illustrates an example of the manner in which the reticle sorter/stocker device 300 sorts and stocks reticles as part of the wafer processing system. The host system conducts a reticle status check at 402 by reticle identification number to determine location and condition of the entire reticle inventory and the reticle inventory within reticle sorter/stocker device 300. A reticle mix at 404, represented in this example by a set of selected reticles within a set of pods, is prepared for presentation to the photolithography area. Reticles are selected by the host system or management input module based on product types and a processing recipe applied to a particular wafer lot. In an alternative system, the reticle mix is prepared at 405 by reticle sorter/stocker 300 before polling at 406 the management input module or host system to determine if additional instructions have been issued that might change the mix or flow of reticles.

Once the reticles are prepared at 405, the reticle sorter/stocker devices 300 poll at 406 the management-input module or the host system for new instructions. New instructions initiate a new reticle mix at either the reticle storage location or the reticle sorter/stocker location. If no new instructions are provided, the reticles are presented at 308 to the photolithography tools. At 310, the reticles are returned from the photolithography area and a degradation analysis is conducted on the reticles. The dimensions of the reticles are scanned and compared to a baseline specification within the computer arrangement to determine the level of degradation that each reticle is exhibiting. Reticles that are still viable for wafer processing are then returned at 312 to either the reticle sorter/stocker or to another storage location. Reticles that are rejected are taken off the line and a communication is sent requesting that a new reticle be incorporated into the reticle inventory system. In a related embodiment, the reticle degradation module has the capability of calculating the time and rate of approach to the failure point of the reticle based on the reticle's current condition and the upcoming wafer lots that will be processed. This provides an advantage of anticipating capital investment costs in ordering new reticles for inventory. The status of each reticle is registered in the host system database and the computer at 402.

As noted above, the above-described approaches are applicable to a number of techniques for managing masks in integrated circuits manufacturing systems. For instance, while the management of reticles in a semiconductor facility is illustrated, the invention extends to cover other the management of different types of masks in different environments. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. An apparatus for sorting and stocking a plurality of masks for use in a wafer processing system, a mask being located within a mask pod, the apparatus comprising:
   means for scanning masks and mask pods, scanning means adapted to identify a mask identification code located on each mask and to scan the dimensions of each mask;
   means for sorting masks and mask pods within a stored location; and
   a computer arrangement adapted to control the scanning means and the sorting means and to record mask data retrieved therefrom, the computer arrangement adapted to analyze the mask data in determining a level of mask degradation for each mask before a mask selection is made.

2. The apparatus of claim 1, wherein the scanning means in combination with the sorting means is adapted to inspect the condition of each mask for use as mask data in a mask degradation model that is operated by the computer arrangement.

3. The apparatus of claim 2, wherein the computer arrangement is further adapted to track the number of exposures and the number of times each mask is handled for use as mask data in the mask degradation model.

4. The apparatus of claim 1, wherein the computer arrangement is adapted to periodically verify that the masks are sorted and to initiate a sorting function in response to the masks being unsorted.

5. The apparatus of claim 1, wherein the sorting means collects a set of masks to preposition the masks in a photolithography processing area so as to increase processing efficiency by reducing set up time.

6. The apparatus of claim 5, wherein the computer arrangement and the sorting means have a processing recipe functionality to aid in prepositioning of masks.

7. The apparatus of claim 1, wherein the computer arrangement signals the scanning means and the sorting means to conduct a mask de-assemble operation when a sorting error occurs.

8. The apparatus of claim 1, wherein the computer arrangement signals the scanning means and the sorting means to conduct an automatic content verification of the pods disposed within the stored location.

9. The apparatus of claim 1, further including a management input module coupled to the computer arrangement for integrating management directives that change the selection of masks used in wafer processing.

10. The apparatus of claim 6, wherein the masks are selected based on the type of processing recipe used.

11. The apparatus of claim 1, wherein the apparatus is composed of a stocking portion and a sorting portion that are decoupled to operate independently of each other.

12. The apparatus of claim 1, further including an enclosure for enclosing the sorting means and the scanning means and including a barrier disposed within the enclosure that provides separation between stored masks and masks being sorted.

13. The apparatus of claim 12, further including a filtering and air flow system coupled to the enclosure.

14. The apparatus of claim 12, further including a vibration control system coupled to the enclosure adapted to substantially reduce vibration within the enclosure.

15. A system for sorting and stocking masks for use in a wafer processing facility, the system comprising:
    means for generating a mask data set that includes information on a mask identification code for each mask and a dimension data for each mask;
    means for conducting a degradation analysis on each mask that includes a comparison of the mask data set to a mask baseline dimension so as to generate degradation data for each mask, using a computer arrangement to record and analyze the degradation data and the mask data set before making a mask selection; and
    means for rearranging the masks at a mask storage location in response a mask selection command from the computer arrangement based on the data analysis.

16. The system of claim 15, wherein the means for rearranging includes means for scanning masks that is adapted to identify a mask identification code located on each mask and to scan mask dimension data and means for sorting masks within a storage location.

17. The system of claim 16, further including a management input module coupled to the computer arrangement and a stocking location, the management module adapted to communicate a directive that changes the selection of masks during wafer processing.

18. The system of claim 17, wherein the computer arrangement and the sorting means include a processing recipe functionality to aid in prepositioning of masks.

19. A method of sorting and stocking masks used in a wafer processing facility, the method comprising:
    providing a mask data set that includes information on a mask identification code for each mask and a dimension data for each mask;
    conducting a degradation analysis on each mask that includes comparing the mask data with a baseline dimension for each mask so as to generate degradation data for each mask, using a computer arrangement to record and analyze the degradation data and the mask data set before a mask selection is made; and
    rearranging the masks at a mask storage location in response to a command from the computer arrangement based on the data analysis.

20. A method of sorting and stocking masks in a wafer processing facility having a photolithography processing area, the method comprising:
    conducting a status check of each mask in the facility and generating a mask data set;
    preparing a mix of masks within a mask storage system and presenting the masks to the photolithography area;
    polling a host system to determine existence of an instruction changing the flow of masks in the photolithography area;
    conducting a degradation analysis on each mask so as to generate degradation data for each mask and using a computer arrangement to record and analyze the degradation data and the mask data set before a mask selection is made; and
    rearranging the masks at a mask storage location in response to a command from the computer arrangement based on the data analysis and communicating the mask status to the host system.

* * * * *